United States Patent [19]

Bell

[11] Patent Number: 4,511,861
[45] Date of Patent: Apr. 16, 1985

[54] VCO HAVING FIELD EFFECT AND BIPOLAR TRANSISTORS IN PARALLEL

[75] Inventor: Robert K. Bell, Lynchburg, Va.

[73] Assignee: General Electric Company, Lynchburg, Va.

[21] Appl. No.: 441,774

[22] Filed: Nov. 15, 1982

[51] Int. Cl.³ .......................... H03B 5/12; H03B 5/02
[52] U.S. Cl. ......................... 331/108 R; 331/108 C; 331/117 FE; 331/117 V; 331/117 R; 330/300; 307/499
[58] Field of Search ............... 307/249, 250, 570, 571, 307/299 R, 495; 330/299, 300; 331/107 R, 108 R, 108 D, 108 C, 117 R, 117 D, 117 FE, 116 FE, 168, 177 V, 56

[56] References Cited

U.S. PATENT DOCUMENTS

| 4,095,252 | 6/1978 | Ochi | 357/34 X |
| 4,138,614 | 2/1979 | Ochi | 307/570 |
| 4,216,443 | 5/1980 | Zaderej | 331/117 FE X |

FOREIGN PATENT DOCUMENTS

| 3030485 | 3/1982 | Fed. Rep. of Germany | 307/570 |
| 25373 | 3/1981 | Japan | 307/570 |

OTHER PUBLICATIONS

"The Goral Oscillator" Published in Radio Communication, vol. 52, No. 5, pp. 359-360, May 1976 by the Radio Society of Great Britain.

Rochleau, D. "Low-Cost Audio Oscillator with Stable Amplitude" EEE, Aug. 1968, p. 138.
Terman, L. M. "Combining Bipolar and FET Devices on a Single Substrate", IBM Technical Disclosure Bulletin, v. 11, n. 10 (Mar. 69), pp. 1270-1271.
Hodowanec, G. "High Power Transistor M/W Oscillators", Microwave Journal, Oct. 1972, pp. 47-66.
Scott, B. N. et al., "Monolithic Voltage Controlled Oscillator for X and Ku Bands", IEEE MTT-S Digest, 1982, pp. 482-485.

Primary Examiner—Eugene R. LaRoche
Assistant Examiner—W. R. Paxman
Attorney, Agent, or Firm—Cushman, Darby & Cushman

[57] ABSTRACT

The gain margin of a junction FET oscillator is improved by the addition thereto of a bipolar transistor in parallel with the FET for boosting the closed loop circuit gain of the oscillator without degrading the phase noise performance of the FET. The oscillator circuit is formed by a grounded gate JFET with a feedback circuit including the internal impedance of the FET, a capacitor which couples source and drain of the FET, a capacitor which couples the FET source to ground, and a resonant circuit coupled between the drain of the FET and ground including a varactor diode for controlling the oscillating frequency and providing a circuit output. A bipolar transistor is coupled in parallel with the FET by coupling its collector to FET's drain and its emitter to the FET's source. The base of the transistor is coupled via a by-pass capacitor to circuit ground.

11 Claims, 2 Drawing Figures

VCO HAVING FIELD EFFECT AND BIPOLAR TRANSISTORS IN PARALLEL

BACKGROUND OF THE INVENTION

The present invention relates to voltage controlled oscillators (VCOs). More specifically, the invention pertains to VCOs of the type used in frequency synthesizers for synthesizing ultra-high frequencies (UHF) and above.

The design of high performance VCOs of the type used in portable radio frequency synthesizers requires the optimization of several parameters. The most significant such parameters are the ratio of output power to phase noise, and current drain. It is generally accepted that junction field effect transistors (JFETs) are the easiest devices to optimize. Therefore, they are generally used in low current high performance VCOs. However, they are only useful for supplying output power output in the low milli-watt range. In addition, JFETs suffer a significant loss in gain with rising temperature.

Bipolar transistor devices can be used to provide higher power levels. However, they provide adequate performance only under certain conditions. When VCOs must be configured to operate at UHF and above, the design task becomes especially difficult for the following reasons. Passive component Q's are lower at UHF than they would be at lower frequencies. Device and interconnect parasitics limit the degree to which phase noise and closed loop gains may be optimized. Phase noise performance degrades as frequency increases. This degradation is approximately 6 dB/octave.

Thus, it is difficult if not impossible to build a highly stable, highly reliable VCO for operation in the UHF range. The problem is made even more difficult when switching circuitry must be incorporated into the radio to move the VCO in frequency to provide a transmit offset.

The literature shows several circuit arrangements which incorporate both transistors and FETs. The following list is intended merely as a representative sample of the patent literature.

U.S. Pat. No. 4,216,443 - Zaderej (Aug. 5, 1980), and "The Goral Oscillator" published in Radio Communication, Vol. 52 No. 5 pp. 359-360, May, 1976 by the Radio Society of Great Britain.

As will be appreciated from the following discussion of the invention, neither of the arrangements shown in these reference documents suggest the central concept of this invention.

SUMMARY OF THE INVENTION

The present invention provides an arrangement for increasing the loop gain of an FET VCO without increasing the operating current in the FET and while preserving the phase noise performance obtainable with an FET. To accomplish this increased closed loop gain, there is provided a bipolar transistor operating in parallel with a grounded gate FET oscillator. The FET forms the basic oscillator with a capacitive feedback circuit. It is self-biased via a biasing circuit coupled from the source of the FET to circuit ground. The circuit output is derived via a tank circuit which also supplies operating power to the FET and which includes a varactor diode for controlling the frequency of oscillation.

A bipolar transistor is coupled in parallel with the FET by coupling its collector to the drain of the FET and its emitter to the source of the FET. Such configuration is not suggested by either of the background art documents.

In the Zaderej '443 patent arrangement, the bipolar transistor and FET are coupled in series rather than in parallel. Further, it teaches the use of a PNP bipolar transistor specifically paired to an N-channel FET and an NPN bipolar transistor specifically paired with a P-channel FET. There is no discussion related to there being different current levels in the bipolar and FET devices.

In the Goral Oscillator article arrangement, there is shown two transistors connected as source/emitter followers. The devices are not in parallel.

In this invention, the transistor base is coupled via a by-pass capacitor to ground and the transistor is biased by a transistor biasing network. The bipolar transistor operates at a substantially smaller current than the FET and essentially supplies gain without degrading the phase noise performance of the FET or significantly supplementing the oscillator output power. The bipolar transistor, while having approximately 8 dB worse phase noise than the FET does not degrade the total oscillator phase noise because the absolute power level of the phase noise due to the bipolar transistor is less than that of the FET.

As the bipolar emitter current is increased, both its contribution to the output power at the oscillating frequency and its phase noise contribution increase. Although one would normally expect the bipolar carrier/noise (c/n) to increase with increasing output power, several other factors tend to keep c/n approximately constant as the emitter current is increased over about a 2:1 range. As a result, a point is reached where the absolute value of the bipolar phase noise reaches the level of the FET phase noise and then begins to degrade the c/n of the combination as the emitter current is further increased.

Thus, there is provided a voltage controlled oscillator (VCO) comprising: an oscillator circuit including a grounded gate field effect transistor (FET) also having source and drain electrodes; means for controlling the oscillating frequency of the JFET oscillator circuit; and a bipolar transistor circuit means coupled in parallel with the JFET oscillator for increasing the closed loop gain of the JFET oscillator circuit without degrading the phase noise performance of the FET oscillator circuit. Thus, the arrangement is highly suitable for VCO circuits where gain performance would be degraded at required operating temperatures.

BRIEF DESCRIPTION OF THE DRAWINGS

A presently preferred exemplary embodiment of the present invention will be described in detail with reference to the drawings wherein.

DETAILED DESCRIPTION OF THE PREFERRED EMBODIMENT

Figure 1:
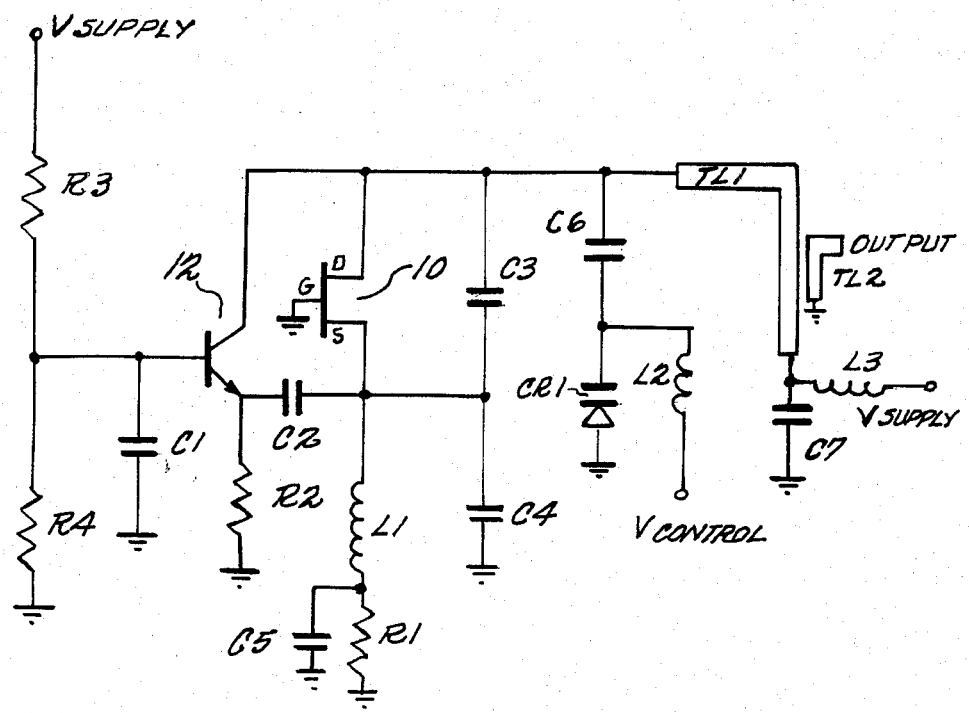
FIG. 1 is a schematic diagram of the VCO according to the present invention.

Referring now to FIG. 1 there is shown a schematic diagram of the VCO according to the present invention. The basic VCO circuit is formed by a grounded gate FET oscillator including an FET 10. FET 10 forms a basic Colpitts oscillator circuit using feedback provided by capacitors C3, C4 and the internal device capacitances of FET 10 and a transistor 12. An inductor L1 provides a high impedance at the oscillating frequency which when decoupled by a by-pass capacitor C5 allows a resistor R1 to establish self-bias with minimal circuit loading. An inductor L2 provides a high impedance at the operating frequency and supplies a control voltage to varactor diode CR1. Transmission line TL1 in series with capacitor C7 supplies the inductive part of the tank circuit. Varactor diode CR1 together with the capacitance of a capacitor C6 provide a variable capacitance for tuning the oscillation frequency as a function of control voltage.

In the preferred embodiment, the circuit is fabricated on a ceramic substrate. A piece of stripline forms a transmission line TL1 coupled at one end to the drain of FET 10. The other end is coupled via a capacitor C7 to ground. Power is supplied to FET 10 via a choke L3 and transmission line TL1. A second piece of stripline forms a transmission line TL2 that is electromagnetically coupled to transmission line TL1 to provide a circuit output.

Of course other output configurations are possible. The output could simply be taken via a capacitor (not shown) coupled directly to the drain of FET 10 or to the source of FET 10.

Bipolar transistor 12 operates at a substantially smaller current than FET 10 and is biased by a network including resistors R2, R3 and R4 along with the RF swing that is present when the oscillator is oscillating. A by-pass capacitor C1 is provided from the base of transistor 12 to circuit ground to allow the transistor to operate as a grounded base oscillator.

Figure 2:
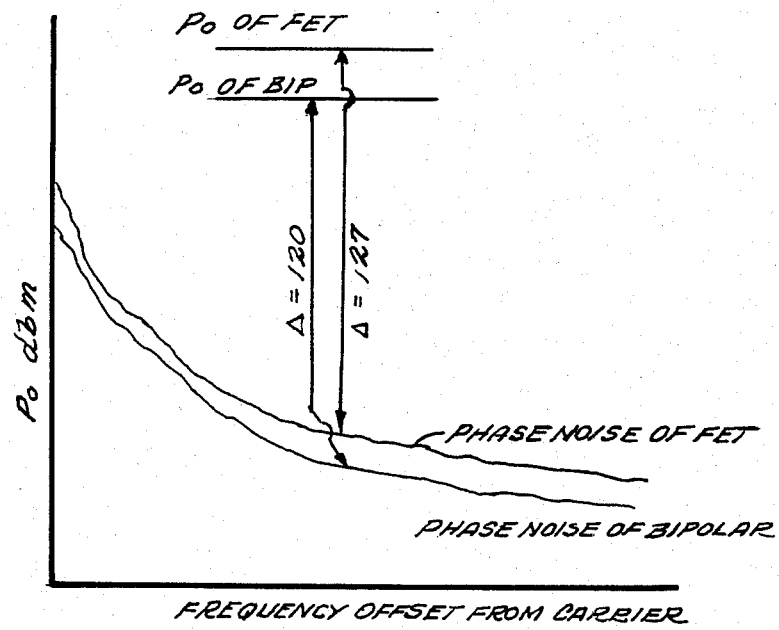
FIG. 2 is a graphical representation of typical phase noise contributions of the FET and bipolar transistor of the VCO according to the present invention.

Referring now to FIG. 2 there is shown a graphical representation of the phase noise contribution of FET 10 and graph shows that bipolar transistor 12. The bipolar transistor 12 essentially supplies gain without degrading the phase noise performance of FET 10 or significantly supplementing the oscillator output power. Transistor 12 has approximately 7 db worse phase noise than FET 10. However, as configured, transistor 12 does not degrade the total oscillator phase noise because the absolute power level of the phase noise due to transistor 12 is less than that of FET 10.

As the bipolar emitter current is increased, both its contribution to the output power at the oscillating frequency and its phase noise contribution increase. Although one would normally expect the bipolar carrier/-noise (c/n) to increase with increasing output power, several other factors tend to keep the c/n approximately constant as the emitter current is increased over about a 2:1 range. As a result, a point is reached where the absolute power of the bipolar phase noise reaches the level of the FET phase noise and then begins to degrade the c/n of the combination as the emitter current is further increased.

It is advantageous to choose a type of small signal bipolar transistor 12 which operates at 10% of the FET current. This would not degrade the phase noise of the entire oscillator and would contribute more than 3 db closed loop gain operating from a 5-volt power supply.

Of course, variations on this basic circuit are possible and can improve circuit performance. In practical embodiments, capacitor C4 can be formed by internal device capacitance. Other alternatives include utilizing switches to remove the effects of the bipolar transistor during receive mode operation of the radio into which the VCO is incorporated particularly where current and phase noise are most important. As another alternative capacitor C2 can be replaced with a more complicated network to aid in impedance matching. Furthermore, resistor R2 can be isolated so as to not load the circuit.

The concepts of the present invention are applicable to other oscillator configurations besides the one shown in FIG. 1 which is merely exemplary. FIG. 1 shows one specific implementation of a Colpitts-type oscillator, i.e. a grounded gate Colpitts oscillator. This circuit can be thought of as an operational amplifier having an inductor coupled between the inverting and non-inverting inputs; two series connected capacitors coupled between the inverting and non-inverting inputs; and a feedback path from the output of the amplifier to the junction of the two capacitors. This basic circuit can be implemented in a variety of ways and with a variety of biasing arrangements. The circuit can be grounded at various points or floating above ground.

While the invention has been described in connection with what is presently considered to be the most practical and preferred embodiments, it is to be understood that the invention is not limited to the disclosure embodiments but on the contrary is intended to cover various modifications and equivalent arrangements included within the spirit and scope of the appended claims, which scope is to be accorded the broadest interpretation so as to encompass all such modifications and equivalent structures.

What is claimed is:

1. A voltage controlled oscillator (VCO) comprising:
an oscillator circuit including a field effect transistor (FET) having gate, source and drain electrodes;
means for controlling the oscillating frequency of said oscillator circuit;
an output circuit coupled to said oscillator circuit; and
a circuit including a bipolar transistor having collector and emitter electrodes coupled in parallel with the source and drain electrodes of said FET for increasing the closed loop gain of the VCO, said bipolar transistor operating at a collector current lower than the drain current of said FET at the oscillating frequency.

2. A VCO according to claim 1 wherein said FET is a junction-type FET (JFET).

3. A VCO according to claim 1 wherein said oscillator circuit comprises, in combination with said FET, a feedback circuit.

4. A VCO according to claim 3 wherein said feedback circuit comprises a first capacitor coupled between said source and drain electrodes of said FET and a second capacitor coupled between said source electrode and circuit ground.

5. A VCO according to claim 1 wherein said controlling means comprises a varactor diode, the impedance of which is a function of an applied electrical signal.

6. A VCO according to claim 1 wherein said FET oscillator circuit has a grounded gate configuration.

7. An arrangement for improving the gain margin of a field-effect transistor (FET) VCO, comprising:
an FET oscillator circuit including a junction-type FET (JFET);
means for controlling the oscillating frequency of said FET oscillator circuit; and bipolar transistor circuit means, including a bipolar transistor with collector and emitter electrodes coupled in parallel with the source and drain electrodes of said JFET, for increasing the open loop gain of said FET oscillator circuit without decreasing the phase noise performance of said FET oscillator circuit, said bipolar transistor circuit means operating at a collector current lower than the drain current of said JFET at the oscillating frequency.

8. An arrangement according to claim 7 wherein said FET oscillator circuit comprises a grounded gate FET oscillator circuit.

9. An arrangement according to claim 7 further including means for self-biasing said FET oscillator circuit.

10. An arrangement according to claim 9 wherein said self-biasing means comprises:
- an inductor providing a high impedance at the oscillating frequency to the source of said JFET;
- a biasing resistor, coupled between said inductor and circuit ground; and
- a by-pass capacitor coupled in parallel with said resistor.

11. An arrangement according to claim 7 wherein said controlling means comprises a varactor diode, the impedance of which is a function of an applied electrical signal.

* * * * *